(12) United States Patent
Kirsch

(10) Patent No.: US 6,735,103 B2
(45) Date of Patent: May 11, 2004

(54) SYSTEM AND METHOD TO AVOID VOLTAGE READ ERRORS IN OPEN DIGIT LINE ARRAY DYNAMIC RANDOM ACCESS MEMORIES

(75) Inventor: Howard C. Kirsch, Eagle, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 10/231,680

(22) Filed: Aug. 29, 2002

(65) Prior Publication Data
US 2004/0042242 A1 Mar. 4, 2004

(51) Int. Cl.⁷ .............................. G11C 5/02; G11C 5/06; G11C 8/00
(52) U.S. Cl. .................. 365/51; 365/63; 365/230.03
(58) Field of Search ...................... 365/51, 63, 190, 365/200, 201, 205, 207, 208, 230.03

(56) References Cited

U.S. PATENT DOCUMENTS 5,608,668 A   3/1997   Zagar et al. ............... 365/149
6,043,562 A   3/2000   Keeth ........................ 257/776
6,515,925 B2  2/2003   Graham et al. ............. 365/205

OTHER PUBLICATIONS

Sekiguchi, T. et al., "A Low–Impedance Open–Bitline Array for Multigigabit DRAM", IEEE Journal of Solid–State Circuits, vol. 37, No. 4, Apr. 2002, pp. 487–498.

Primary Examiner—Trong Phan
(74) Attorney, Agent, or Firm—Dorsey & Whitney LLP

(57) ABSTRACT

Selective coupling devices directed by coupling controllers prevent cell plate and/or substrate disturbances from causing memory cell read and refresh errors in open digit line array memory devices. Using selective decoupling devices, when memory cells in an active row store an appreciably unbalanced number of either zeroes or ones, reading the cells generates a voltage transient in the cell plate and/or substrate that can be coupled to a reference digit line because the cell plates and/or substrates of the active sub-array are normally coupled to the cell plates and/or substrates of the reference arrays. By decoupling the cell plate and/or substrate of the active sub-array from the cell plates and/or substrates of the reference arrays, any coupling of the voltage transients to reference digit lines is reduced.

44 Claims, 6 Drawing Sheets

SYSTEM AND METHOD TO AVOID VOLTAGE READ ERRORS IN OPEN DIGIT LINE ARRAY DYNAMIC RANDOM ACCESS MEMORIES

TECHNICAL FIELD

This invention relates to DRAM devices. More particularly, the present invention is directed to DRAM devices employing open digit line array architecture.

BACKGROUND OF THE INVENTION

As is well known in the art and shown in FIG. 1, a DRAM cell 100 typically comprise a capacitor 104 and access transistor 108 pair. One plate of the capacitor 104 is connected to a common cell plate (not shown) to which all capacitors in that DRAM cell array are connected, a subset of which is shown in FIG. 1. The other plate of the capacitor 104 is coupled to a drain of the access transistor 108. The gate of the access transistor 108 is connected to a word line 116 which allows all the DRAM cells coupled to each word line 116 to be activated, while the source of the access transistor 108 is coupled to a digit line 120 which the DRAM cell 100 will read from and write to during memory operations. Activating the gate of the access transistor allows a high voltage charge (Vcc) or low voltage charge (ground) carried by the digit line 120 to pass to the capacitor 104, thus writing the voltage of the digit line 120 to the capacitor 104.

DRAM cell storage technology of this type is understandably transitory in nature: the high or low voltage charge written to the capacitor will eventually dissipate, as charges stored across capacitors are known to do. As also is known in the art, stored charges leak across the dielectric core between the transistor plates, and voltages can leak from the plates through the access transistors to which they are connected. As a result, the contents of DRAM cells typically must be refreshed hundreds of times per second.

A network of sense amplifiers 124 (FIG. 1) typically are used to refresh the contents of the DRAM cells, each of the sense amplifiers 124 comparing voltages received on pairs of digit lines 120 to which each is connected.

The memory cells 100 are shown in FIG. 1 arranged in an open digit line configuration in which each sense amplifier 124 is coupled to a column of memory cells in one array 125 and another column of memory cells in another memory array 126. Each pair of digit lines 120 to which each sense amplifier 124 is connected comprises an active digit line and a reference digit line. The active digit line 128 is the digit line in one array 125 to which the access transistors 108 of the DRAM cells 100 being refreshed are coupled upon activation of the word lines 116 activating the gates of the access transistors 108. The active digit line is assumed to be the top digit line 128 in the array 125 for purposes of the example of FIG. 1. The reference digit line 132 is a digit line connected to a row of DRAM cells 100 whose contents will not be refreshed during the refresh cycle and is assumed to be the digit line 132 in the array 126 for purposes of the example of FIG. 1. Prior to the refresh cycle, both the active digit line 128 and reference digit lines 132 are equilibrated by precharging the digit lines 120 to Vcc/2 so that the sense amplifiers 124 can measure the voltage disparity between them.

When the access transistors 108 of the DRAM cells 100 coupled to the active digit line 132 and the sense amplifiers 124 are activated, each of the sense amplifiers 124 determines which of the two digit lines 120 carries the higher voltage and the lower voltage, and then drives the higher voltage digit line toward Vcc and the lower voltage digit line toward ground. Thus, when the row of DRAM cells 100 coupled to the active digit line 128 is activated, each of these DRAM cells 100 storing a high voltage charge, even allowing for leakage which necessitates these refresh cycles, should carry a voltage of something greater than Vcc/2. Similarly, DRAM cells 100 storing a low voltage charge, allowing for leakage, should carry a voltage of less than Vcc/2. Ideally, therefore, the sense amplifiers drive the DRAM cell 100 coupled to each of the active digit lines toward Vcc or ground, whichever voltage was stored in the DRAM cell 100 before it was refreshed.

However, conditions are not always ideal. For example, depending upon the combinations of charges stored in the DRAM cells 100 coupled to the active digit lines 128, the sense amplifiers 124 might not accurately read the charges on the DRAM cells 100 coupled to the active digit lines 124. For example, if a capacitor 104 of a DRAM cells 100 stores a high voltage charge, but, for some reason, the voltage read by the sense amplifier 124 appears to be below the equilibrated Vcc/2 value of the reference digit line 132, the sense amplifier 124 will drive the active digit line 132 toward ground, refreshing the previously high voltage charge carrying DRAM cell to 100 a low voltage state, corrupting data One way this can happen is through voltage fluctuations or noise affecting digit lines to which a sense amplifier 124 is coupled. More specifically, since the active digit line 128 extends though one array 125 and the reference digit line 132 extends through a different array 126, the active digit line 128 and the reference digit lines 132 can be exposed to different noise sources. Noise signals coupled to one of the digit lines 128 or 132 but not the other 132 or 128 can cause the sense amplifiers 124 to sense an erroneous voltage level. The manner in which noise signals can be coupled to the active digit line 128 and the reference digit line 132 will be discussed in greater detail below.

As mentioned earlier, differential noise coupled to the digit lines 128, 132 is a problem with the open digit line architecture shown in FIG. 1 primarily because the active digit line 128 and the reference digit line 132 extend through different arrays 125, 126, respectively. In contrast, an array 250 having a folded digit line architecture shown in FIG. 2A does not have this problem. The folded digit line array 250 includes a sense amplifier 262 coupled to respective complimentary pairs of digit lines 258 provided for each column 266 of memory cells 254. Each digit line 258 is connected to alternate memory cells 254 in each column 266. For each read or write operation, one of the digit lines 258 in each pair serves as the active digit line and the other digit line 258 in the pair serves as the reference digit line. Thus, instead of extending through different arrays as in an open digit line architecture, active and reference digit lines 258 having a folded architecture extend through the same array 250 in close proximity with each other. As a result, arrays 250 having a folded digit line architecture have good common mode noise rejection since the active and reference digit lines 258 are exposed to the same noise sources to substantially the same degree.

Although a folded digit line architecture provided good common mode noise immunity, it has the disadvantage of consuming more area on a semiconductor die (not shown) compared to an open digit line architecture, which is shown in FIG. 2B. As is well known in the art, each memory cell in an open digit line architecture requires only $4F^2$ or $6F^2$ in area, where F represents the feature size, whereas each memory cell 254 in a folded digit line architecture requires 8F² in area. This significant disparity allows memory devices using an open digit line architecture to consume substantially less space on a semiconductor die so that such memory device can be substantially cheaper than memory devices using a folded digit line architecture.

FIG. 2B shows two open digit line sub-arrays 200 and 202. Digit lines 203, 204 connected to each sense amplifier 206 in the open digit line sub-arrays 200 and 202 are not connected to memory cells 208 in the same sub-array. Instead, each sense amplifier 206 is connected to one digit line 203 in one sub-array 200 and one digit line 204 in a second sub-array 202. Each sub-array 200, 202 has its own cell plate 210, 212, respectively coupled to the memory cell capacitors in its respective sub-array 200, 202. Furthermore, each sub-array 200, 202 is often fabricated in separate semiconductor wells that form separate substrates 214, 215 that are isolated from each other, such as by using a "triple well" structure, which is known in the art. As will be appreciated, the digit lines 203 in the first sub-array 200 can be exposed to difference noise sources than the noise sources to which the digit lines 204 in the second sub-array are exposed. Noise can be coupled to the digit lines 203, 204 differently for several reasons. For example, because the digit lines 203, 204 in the different sub-arrays 200, 202 are fabricated in different substrates, noise signals generated in the substrates can be coupled to the digit lines 203, 204. Differential noise can also result from noise signals coupled to differently to the cell plates 210, 212 in each sub-array 200, 202, respectively.

Various approaches have been used to improve the noise immunity of memory devices using an open digit line architecture. One approach has been to couple corresponding nodes in the sub-arrays 200, 202 to each other so that a voltage disturbance or noise in one of the nodes will also occur in the corresponding node. As a result, if the voltage disturbance or noise is coupled from the node to a digit line in one array, the voltage disturbance will, in theory, also be coupled from the corresponding node to the corresponding digit line in the other array. For example, as shown in FIG. 2B, the cell plate 210 of the first sub-array 200 and the cell plate 212 of the second sub-array 202 are electrically connected by a conductive coupling 217. Theoretically, this measure should alleviate uneven cell plate disturbances by bringing all the coupled cell plates to the same voltage. Similarly, a conductor 219 is used to couple the substrate 214 in which one sub-array 200 is fabricated to the substrate 215 in which the other array 202 is fabricated. Although these conductive couplings 217, 219, as well as other conductors (not shown) coupling corresponding nodes to each other, do, in fact, improve the noise immunity of the sub-arrays 200, 202 in some cases, they can actually creates noise problems that have very adverse consequences, as will be explained below.

With further reference to FIG. 2B, assume that one of the memory cell capacitors 216 in the sub-array 200 is storing a high voltage, e.g., $V_{CC}$, and all of the other memory cell capacitors in the sub-array 200 are storing a low voltage, e.g. ground potential. This is known as a "1 in a sea of zeros" situation. The capacitor 216 and all of the other capacitors in the sub-array 200 are coupled to the same cell plate 210. As previously explained, the digit lines 203 in the sub-array 200 are equilibrated to one-half the supply voltage, i.e., $V_{CC}/2$, prior to a memory read operation. Assuming that the sub-array 200 is an active array, when the access transistors 203 are activated for the memory cells 208 storing a 0, the voltage on each of the capacitor plates in such memory cells quickly transition from 0 volts to the equilibrated voltage $V_{CC}/2$ of the digit lines. The sudden increase in voltage coupled to all of the memory cell capacitors except for the capacitor 216 causes the voltage of the cell plate 210 to also increase. The voltage increase on the cell plate 210 is also coupled to the memory cell capacitor 216, which has a plate that has been charged to $V_{CC}$.

The cell plate 210 is also coupled to the capacitor 104 of the lone cell 216 storing a 1. As a result, the cell plate 210 will tend to drive the voltage stored in the capacitor 216 higher as well. This makes it more likely that the sense amplifier 206 will correctly sense the voltage on the capacitor 216 as corresponding to a 1. However, because the cell plate 210 of the sub-array 200 is also coupled to the cell plate 212 of the array 202, the voltage on the cell plate 212 also increases. This increase in voltage of the cell plate 212 can be capacitively coupled to the reference digit line 204 in the array 202. In fact, the voltage disturbance on the cell plate 210 can be coupled to the reference digit line 204 with an even greater magnitude than it is coupled to the active digit line 203, partly because any voltage increase in the active digit line 203 is coupled to the capacitor 216, which somewhat acts as a low-pass filter. Thus, the conductor 217 provided to couple the cell plates 210, 212 to each other for the purpose of reducing data read errors, can actually increase data read errors. Similarly, the conductor 219 coupling of the substrates 214, 215 for the sub-arrays 200, 202, respectively, to each other can also increase rather than decrease memory read errors.

In an open digit line array architecture device, the types of cell plate and semiconductor substrate disturbances previously described could be overcome by refreshing the memory cells more often. After all, if memory cells were refreshed before the voltages they stored dissipated so as to closely approach Vcc/2, the type of voltage disturbances previously discussed would no longer pose a problem. On the other hand, refreshing memory cells consumes appreciable amounts of power, and it is desirable to reduce power consumption in memory devices to avoid generation of waste heat and, more importantly, to help prolong battery life in portable devices.

There is therefore a need for a circuit and method that can obtain the size advantages of an open digit line architecture without incurring the power consumption costs typically incurred by the higher refresh rates needed for memory devices using an open digit line architecture.

SUMMARY OF THE INVENTION

The present invention is directed to a system and method for selectively coupling and decoupling sub-arrays in open digit line array memory devices to prevent cell plate and semiconductor substrate disturbances from causing memory cell read and refresh errors. In particular, the present invention exploits the fact that, when the memory cells in a sub-array store an appreciably unbalanced number of either zeroes or ones, the nominal voltages of the cell plate and/or substrate for the sub-array undergo transient changes that can result in data read errors. More specifically, in an open digit line architecture, the present invention couples cell plates and/or substrates to the cell plates and/or substrates, respectively, between adjacent arrays to allow for the equalization of cell plate and/or substrate voltages up until the equilibrated active digit lines are to be coupled to the memory cells to read and/or refreshed the memory cells. The cell plate and/or substrate for the active sub-array are then decoupled from the cell plate and/or substrate of the reference sub-arrays to reduce the coupling of any voltage transient in the cell plate and/or substrate of the active sub-array to the cell plate and/or substrate of the reference sub-arrays.

DETAILED DESCRIPTION OF THE INVENTION

Figure 1:
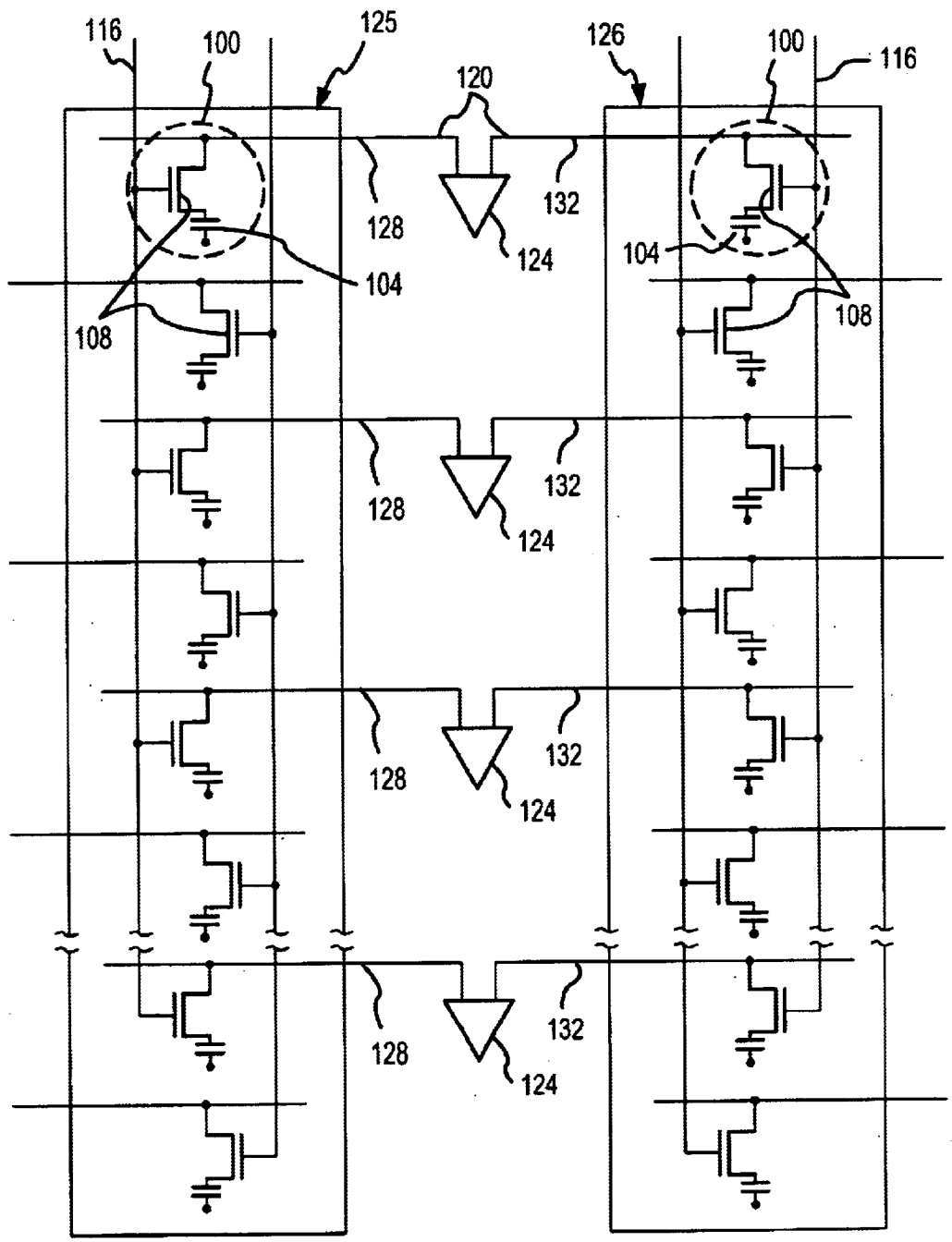
FIG. 1 is a schematic diagram of portions of conventional sub-arrays of DRAM memory cells having an open digit line architecture.
Figure 2A:
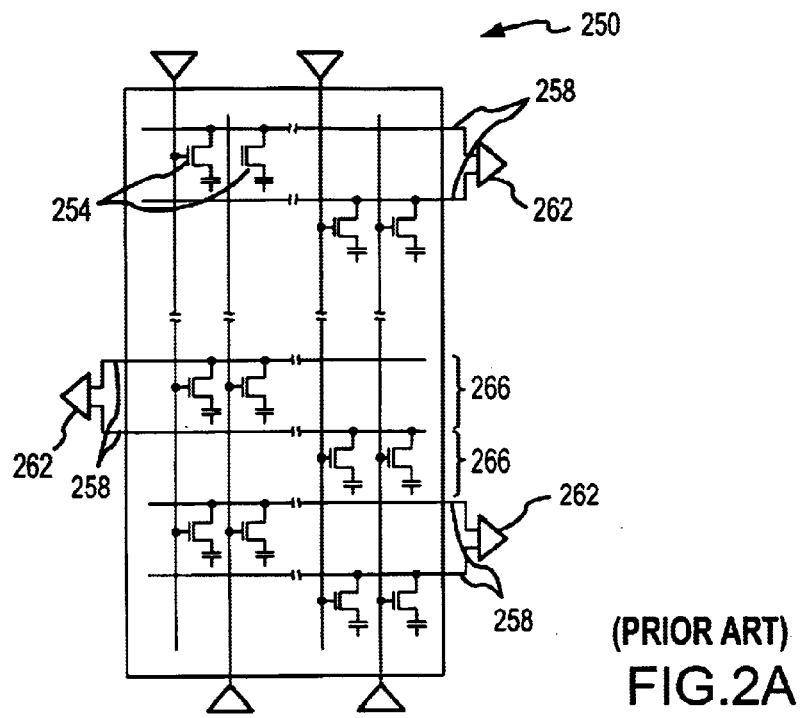
FIG. 2A is a schematic diagram of a conventional folded digitlinedigit line array architecture sub-array.
Figure 2B:
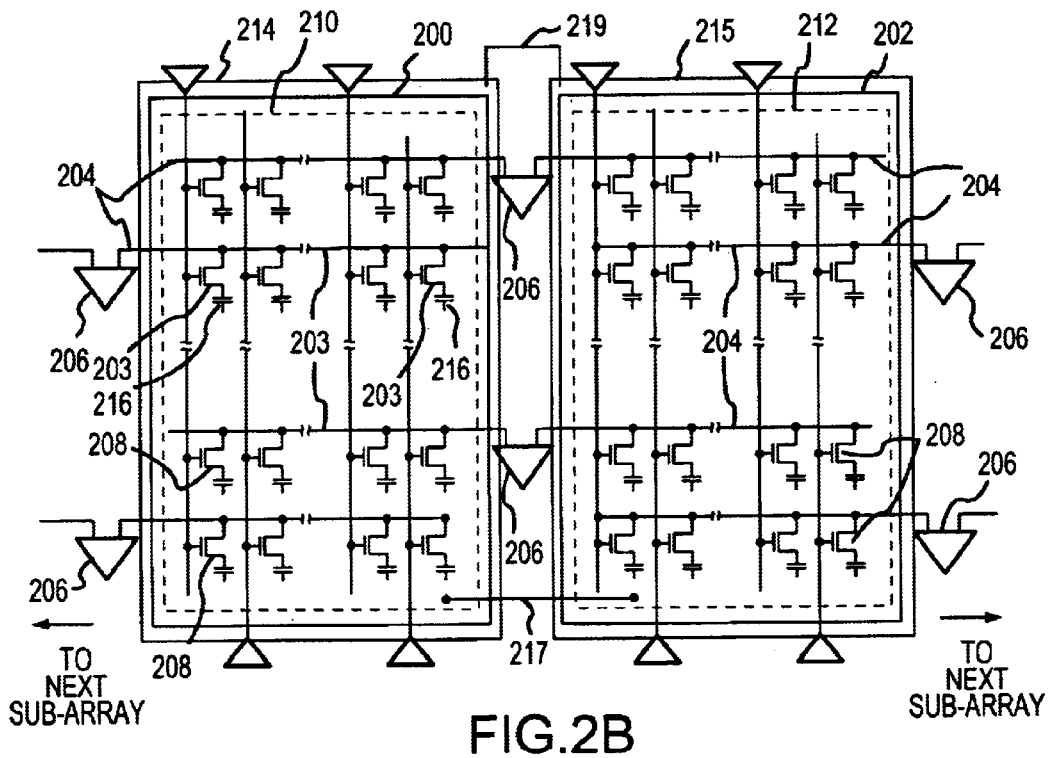
FIG. 2B is a schematic diagram of a pair of conventional open digit line array architecture sub-arrays with coupled cell plates and substrates.
Figure 3A:
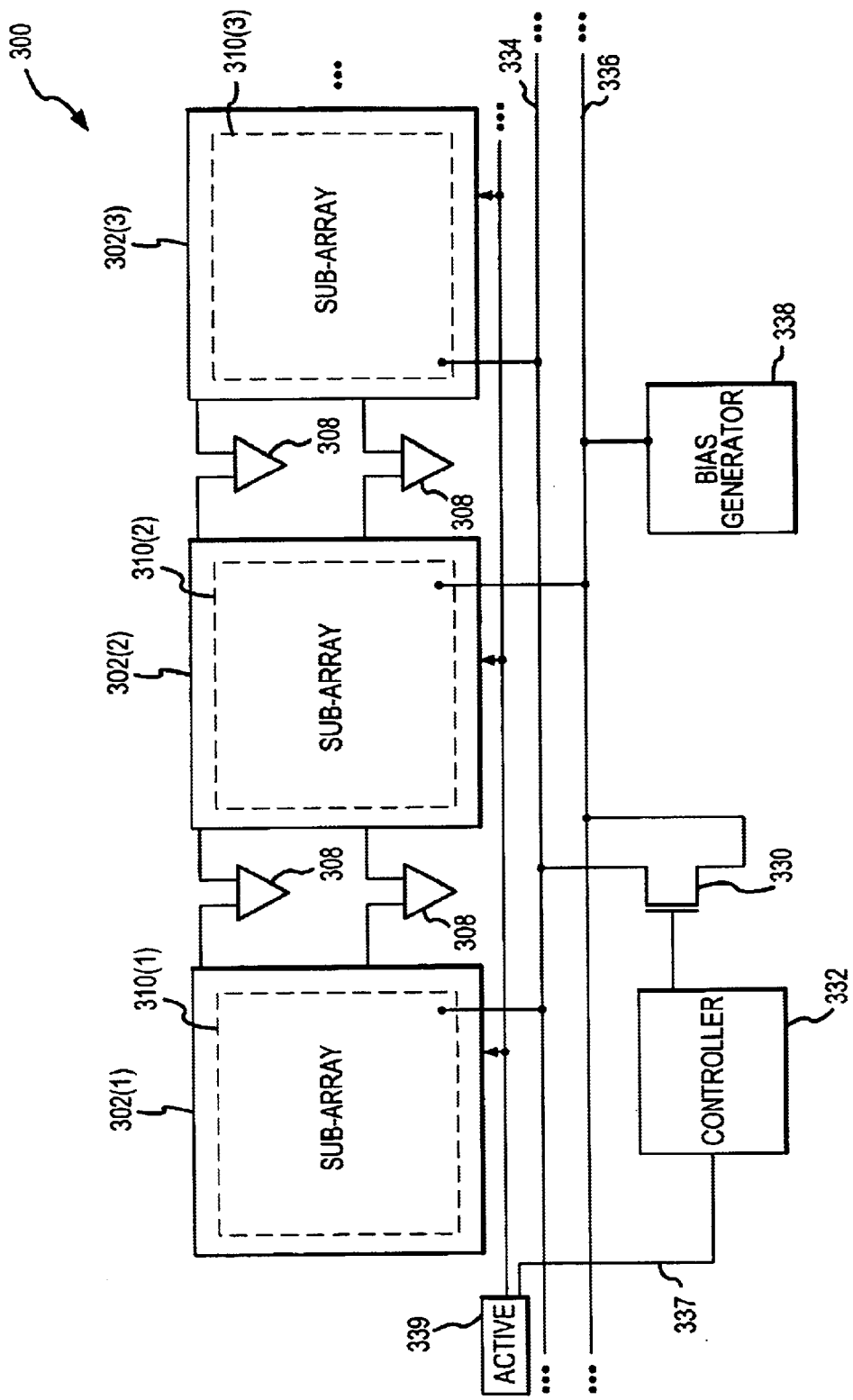
FIG. 3A is a block diagram of a first embodiment of the present invention featuring cell plate decoupling devices and control logic to selectively decouple an active sub-array from a reference sub-array.

FIG. 3A is a block diagram of a selective cell plate coupling system 300 for selectively coupling cell plates of adjacent sub-arrays to each other in an open digit line architecture. FIG. 3A shows N sub-arrays, namely sub-array 302(1), sub-array 302(2), sub-array 302(3). The sub-arrays 302 designated by an odd number in parentheses are coupled to odd-numbered word lines (not shown) and the sub-arrays 302 designated by an even number in parentheses are coupled to even-numbered word lines (not shown). Thus, when even numbered word lines are activated, one or more of the even-numbered arrays function as active arrays and the adjacent odd-numbered arrays function as reference arrays. Similarly, when odd numbered word lines are activated, one or more of the odd-numbered arrays function as active arrays and the adjacent even-numbered arrays function as reference arrays. A plurality of sense amplifiers 308 are used to read memory cells (not shown in FIG. 3A) coupled to respective active digit lines by comparing them with respective reference digit lines. The capacitors of the memory cells (not shown) in each sub-array 302 are coupled to individual sub-array cell plates 310(1), 310(2), and 310(3). This much of the system 300 is conventional and known in the art.

Added to this system is a selective cell plate coupling transistor 330 which is coupled to a controller 332. The transistor 330 has one of its terminals coupled through signal line 334 to all of the odd-numbered sub-arrays 302 and the other of its terminals coupled through signal line 336 to all of the even-numbered sub-arrays 302. The controller 332 receives signals generated by other circuitry in a DRAM providing an indication of when a memory read operation is to occur, such as from a row active line 337. For example, as shown in FIG. 3A. an active circuit 339 is coupled to the sub-arrays 302 for activation thereof, and is further coupled to the controller 332 to provide a signal to the controller 332 via the row active line 337 that is indicative of when a memory operation is to occur. The controller 332 normally applies a signal to the gate of the transistor 330 to turn ON the transistor 330. The transistor 330 and signal lines 334, 336 then couple the cell plates 310 of all of the odd-numbered sub-arrays 302 to the cell plates 310 of all of the even-numbered sub-arrays 302. Thus, in this condition, the cell plates of adjacent sub-arrays 302 are coupled to each other. A $V_{CC}/2$ generator 338 is coupled to the signal line 336 to bias the cell plates 310 of the even sub-arrays 302 to $V_{CC}/2$. Of course, when the transistor 330 is ON, the $V_{CC}/2$ generator 338 is also coupled to the signal line 334 to bias the cell plates 310 of the odd sub-arrays 302 to $V_{CC}/2$. The large capacitance of the cell plates 310 allows the voltage of the cell plates 310 for the odd-numbered sub-arrays 302 to remain essentially constant at $V_{CC}/2$.

In operation, the controller 332 maintains the transistor 330 ON so that the sub-arrays 302 operate in a convention manner, as described above. When a memory read is to occur, the controller 332 outputs a signal that turns OFF the transistor 330. The transistor 330 then isolates the cell plates 310 of all of the even-numbered sub-arrays 302 from the cell plates 310 for all of the odd-numbered sub-arrays 302. In doing so, the transistor 330 isolates the cell plate 310 for each sub-array 302 from the the cell plates 310 for adjacent sub-arrays 302. Therefore, the cell plate 310 for the active sub-array 302 is always isolated from the cell plate 310 for the reference sub-arrays 302. For this reason, any coupling of a transient voltage in the cell plate 310 for the active sub-array 302 to a reference digit line (not shown) will have a relatively low magnitude.

Figure 3B:
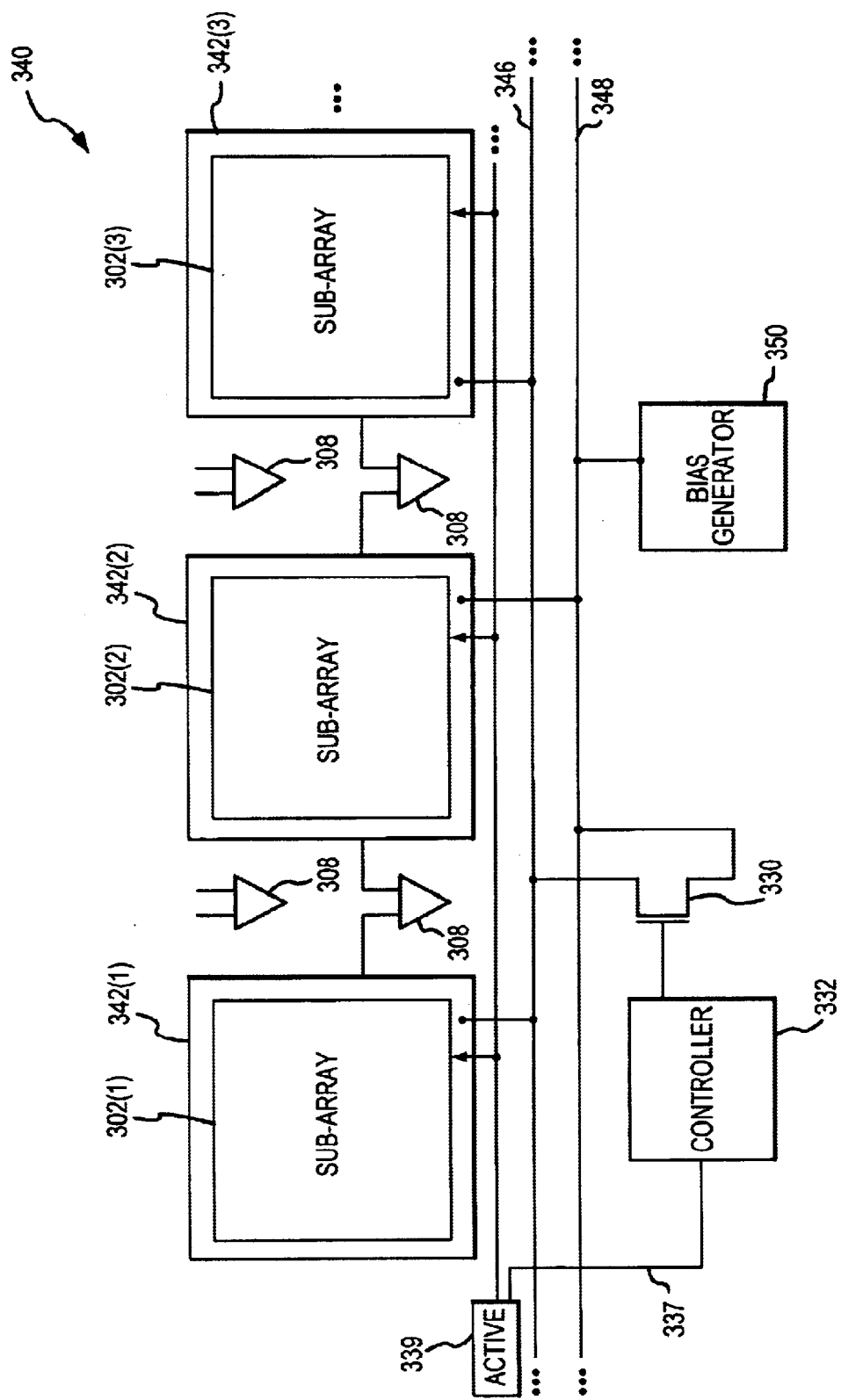
FIG. 3B is a block diagram of a second embodiment of the present invention featuring cell plate decoupling devices and control logic to selectively decouple an active sub-array from other sub-arrays.

FIG. 3B shows another embodiment of the invention in which a system 340 is used to selectively couple the substrates of adjacent arrays to each other. More specifically, each of the sub-arrays 302 is fabricated in a substrate 342. The substrates 342 for the odd-number sub-arrays 302 are coupled to a first signal line 346 and the substrates 342 for the even-numbered sub-arrays 302 are coupled to a second signal line 348. The remainder of the system 340 is identical to the system 300 of FIG. 3A and it operates in the same manner except that a substrate bias generator 350 is used in the system 340 in place of the $V_{CC}/2$ generator used in the system 300. The substrate bias generator 350 biases the substrates 342 for the sub-arrays 302 at a suitable bias voltage, such as zero volts or a slight negative voltage, as is well known in the art.

In operation, the controller 332 maintains the transistor 330 ON during normal operation so that the substrates of all of the sub-arrays 302 are coupled to each other and to the substrate bias generator 350. When a memory read is to occur, the controller 332 outputs a signal that turns OFF the transistor 330. The transistor 330 then isolates the substrates 342 for all of the even-numbered sub-arrays 302 from the substrates 342 for all of the odd-numbered sub-arrays 302. In doing so, the transistor 330 isolates the substrate 342 for each sub-array 302 from the substrates 342 for the adjacent sub-arrays 302. Therefore, the substrate 342 for the active sub-array 302 is always isolated from the substrates 342 for for the reference sub-arrays 302. Any coupling of a transient voltage in the substrate 342 for the active sub-array 302 to a reference digit line (not shown) will therefore have a relatively low magnitude.

The system 300 shown in FIG. 3B for selectively coupling cell plates 310 to each other and the system 340 for selectively coupling substrates 342 to each other may be used individually or in combination with each other.

Figure 4:
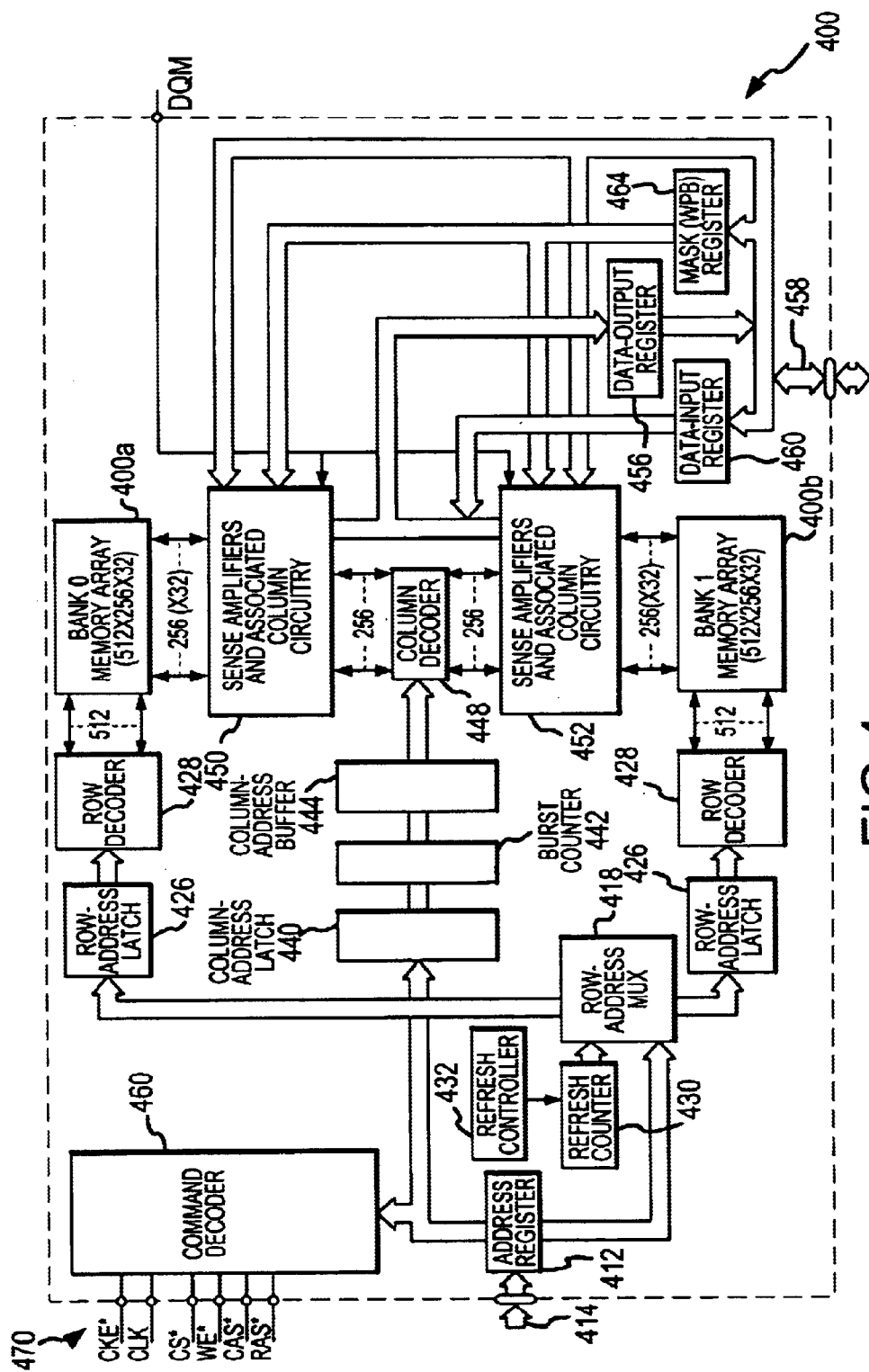
FIG. 4 is a block diagram of a SDRAM device incorporating an embodiment of the present invention.

A memory device employing an embodiment of the present invention is shown in FIG. 4. The memory device shown in FIG. 4 is a synchronous dynamic random access memory ("SDRAM") device 400, although embodiments of the present invention may be used in other DRAMs and other memory devices. The SDRAM device 400 includes an address register 412 that receives either a row address or a column address on an address bus 414. The address bus 414 is generally coupled to a memory controller (not shown). Typically, a row address is initially received by the address register 412 and applied to a row address multiplexer 418. The row address multiplexer 418 couples the row address to a number of components associated with either of two memory arrays 400a, 400b, depending upon the state of a bank address bit forming part of the row address. The memory arrays 400a, 400b have an open-array architecture incorporating one or both embodiments of the invention as shown in FIGS. 3A and 3B. Associated with each of the memory arrays 400a, 400b is a respective row address latch 426, which stores the row address, and a row decoder 428, which applies various signals to its respective memory array 400a or 400b as a function of the stored row address. The row address multiplexer 418 also couples row addresses to the row address latches 426 for the purpose of refreshing the memory cells in the memory arrays 400a, 400b. The row addresses are generated for refresh purposes by a refresh counter 430, which is controlled by a refresh controller 432.

After the row address has been applied to the address register 412 and stored in one of the row address latches 426, a column address is applied to the address register 412. The address register 412 couples the column address to a column address latch 440. Depending on the operating mode of the SDRAM device 400, the column address is either coupled through a burst counter 442 to a column address buffer 444, or to the burst counter 442, which applies a sequence of column addresses to the column address buffer 444 starting at the column address that is stored in the column-address latch. In either case, the column address buffer 444 applies a column address to a column decoder 448, which applies various column signals to respective sense amplifiers and associated column circuitry 450, 452 for the respective memory arrays 400a, 400b.

Data to be read from one of the memory arrays 400a, 400b are coupled to the column circuitry 450, 452 for one of the memory arrays 400a, 400b, respectively. The data are then coupled to a data output register 456, which applies the data to a data bus 458. Data to be written to one of the memory arrays 400a, 400b are coupled from the data bus 458 through a data input register 460 to the column circuitry 450, 452 and then are transferred to one of the memory arrays 400a, 400b, respectively. A mask register 464 may be used to selectively alter the flow of data into and out of the column circuitry 450, 452, such as by selectively masking data to be read from the memory arrays 400a, 400b.

The above-described operation of the SDRAM 400 is controlled by a command decoder 468 responsive to high level command signals received on a control bus 470. These high level command signals, which are typically generated by a memory controller (not shown), are a clock enable signal CKE*, a clock signal CLK, a chip select signal CS*, a write enable signal WE*, a column address strobe signal CAS*, and a row address strobe signal RAS*, with the "*" designating the signal as active low or complement. The command decoder 468 generates a sequence of control signals responsive to the high level command signals to carry out the function (e.g., a read or a write) designated by each of the high level command signals. These control signals, and the manner in which they accomplish their respective functions, are conventional. Therefore, in the interest of brevity, a further explanation of these control signals will be omitted.

Figure 5:
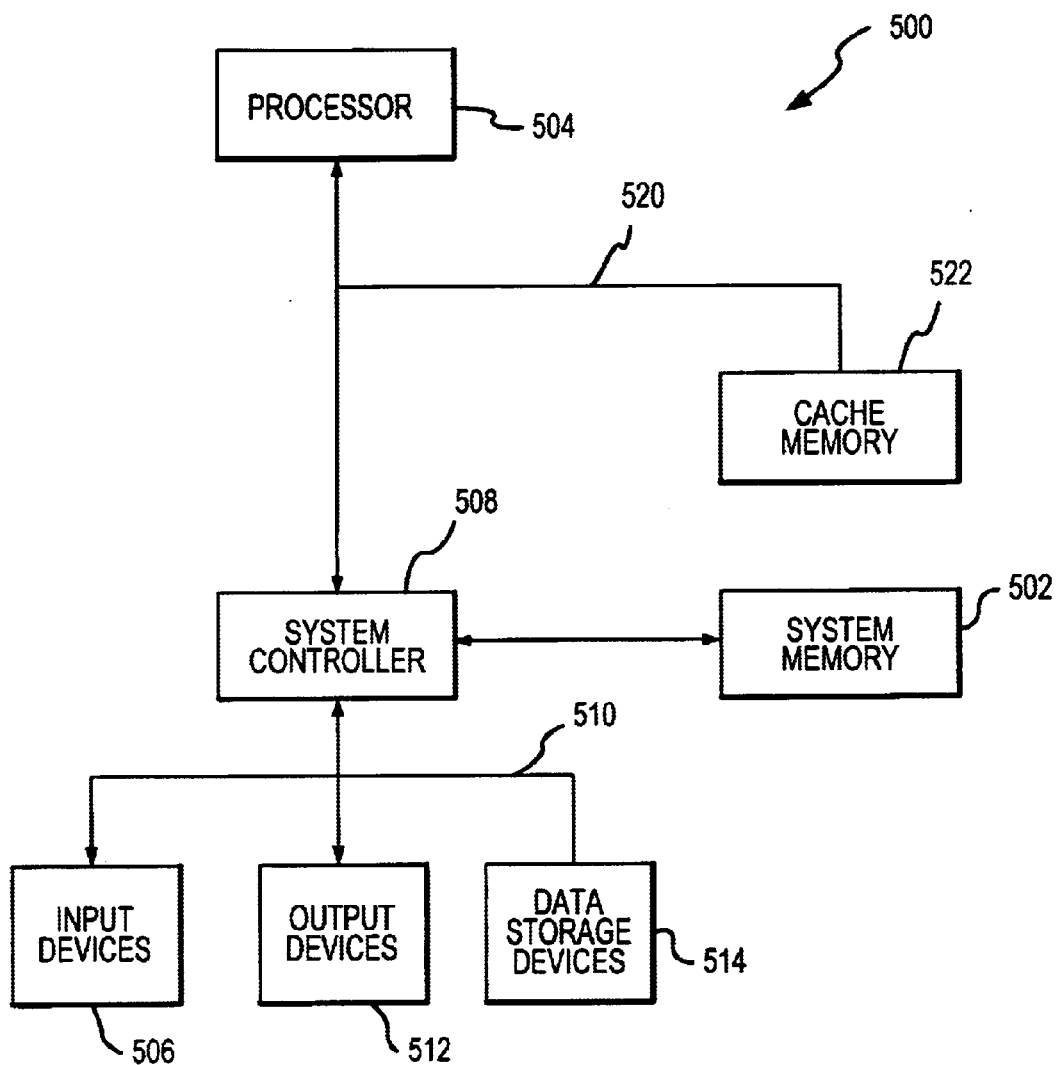
FIG. 5 is a block diagram of a computer system incorporating an embodiment of the present invention.

As shown in FIG. 5, a computer system 500 can take advantage of an embodiment of the present invention by incorporating in its system memory 502 DRAM devices adapted with one or both embodiments of the present invention as previously described. With reference to FIG. 5, a computer system 500 includes the system memory 502 and a processor 504 for performing various functions, such as performing specific calculations or tasks. In addition, the computer system 500 includes one or more input devices 506, such as a keyboard or a mouse, coupled to the processor 504 through a system controller 508 and a system bus 510 to allow an operator to interface with the computer system 500. Typically, the computer system 500 also includes one or more output devices 512 coupled to the processor 504, such output devices typically being a printer or a video terminal. One or more data storage devices 514 are also typically coupled to the processor 502 through the system controller 508 to store data or retrieve data from external storage media (not shown). Examples of typical data storage devices 514 include hard and floppy disks, tape cassettes, and compact disk read-only memories (CD-ROMs). The system memory 502 is coupled directly (not shown) to the processor 504 or to the system controller 508 to allow data to be written to and read from the system memory 502. The computer system 500 may also include a cache memory 522 coupled to the processor 502 through a processor bus 520 to provide for the rapid storage and reading of data and/or instructions, as is well known in the art.

From the foregoing it will be appreciated that, although specific embodiments of the invention have been described herein for purposes of illustration, various modifications may be made without deviating from the spirit and scope of the invention. For example, it will be appreciated that many variations can be applied to the embodiments shown within the broad concepts of the present invention. Accordingly, the invention is not limited except as by the appended claims.

What is claimed is:

1. A voltage reading enhancement system for an open digit line array DRAM device comprising a plurality of sub-arrays, the voltage reading enhancement system comprising:
    a selective coupling device selectively electrically coupling a component of an active sub-array to a corresponding component of a reference sub-array; and
    a controller coupled with the selective coupling device and operable to receive an active row signal, the active row signal indicating an active row of memory cells within the active sub-array is to be coupled with an active digit line, the controller being responsive to the active row signal to direct the selective coupling device to decouple the component in the active sub-array from the corresponding component in the reference sub-array when the active row signal is received.

2. The voltage reading enhancement system of claim 1 wherein the component of the active sub-array comprises a cell plate of the active sub-array, and wherein the corresponding component of the reference sub-array comprises a cell plate of the reference sub-array.

3. The voltage reading enhancement system of claim 1 wherein the component of the active sub-array comprises a substrate of the active sub-array, and wherein the corresponding component of the reference sub-array comprises a substrate of the reference sub-array.

4. The voltage reading enhancement system of claim 1 wherein the selective coupling device is a transistor the controller selectively causes to conduct when memory cells are not being read and selectively not to conduct when the memory cells are being read.

5. The voltage reading enhancement system of claim 1 wherein the controller is responsive to direct the selective coupling device to recouple the component in the active sub-array to the corresponding component in the reference sub-array when the active row signal is not received.

6. A voltage reading enhancement system for an open digit line array DRAM device comprising a plurality of sub-arrays, the voltage reading enhancement system comprising:
 a selective coupling device selectively electrically coupling a cell plate of an active sub-array to a corresponding cell plate of a reference sub-array; and
 a controller coupled with the selective coupling device and operable to receive an active row signal, the active row signal indicating an active row of memory cells within the active sub-array is to be coupled with an active digit line, the controller being responsive to the active row signal to direct the selective coupling device to decouple the cell plate in the active sub-array from the corresponding cell plate in the reference sub-array when the active row signal is received.

7. The voltage reading enhancement system of claim 6 further comprising a second selective coupling device selectively electrically coupling a substrate of the active sub-array to a corresponding substrate of the reference sub-array.

8. The voltage reading enhancement system of claim 6 wherein the selective coupling device is a transistor the controller selectively causes to conduct when memory cells are not being read and selectively not to conduct when the memory cells are being read.

9. The voltage reading enhancement system of claim 7 wherein the second selective coupling device is a transistor the controller selectively causes to conduct when memory cells are not being read and selectively not to conduct when the memory cells are being read.

10. The voltage reading enhancement system of claim 6 wherein the controller is responsive to direct the selective coupling device to recouple the cell plate in the active sub-array to the corresponding cell plate in the reference sub-array when the active row signal is not received.

11. The voltage reading enhancement system of claim 7 wherein the controller is responsive to direct the second selective coupling device to recouple the substrate in the active sub-array to the corresponding substrate in the reference sub-array when the active row signal is not received.

12. A voltage reading enhancement system for an open digit line array DRAM device comprising a plurality of sub-arrays, the voltage reading enhancement system comprising:
 a selective coupling device selectively electrically coupling a substrate of an active sub-array to a corresponding substrate of a reference sub-array; and
 a controller coupled with the selective coupling device and operable to receive an active row signal, the active row signal indicating an active row of memory cells within the active sub-array is to be coupled with an active digit line, the controller being responsive to the active row signal to direct the selective coupling device to decouple the substrate in the active sub-array from the corresponding substrate in the reference sub-array when the active row signal is received.

13. The voltage reading enhancement system of claim 12 further comprising a second selective coupling device selectively electrically coupling a cell plate of the active sub-array to a corresponding cell plate of the reference sub-array.

14. The voltage reading enhancement system of claim 12 wherein the selective coupling device is a transistor the controller selectively causes to conduct when memory cells are not being read and selectively not to conduct when the memory cells are being read.

15. The voltage reading enhancement system of claim 13 wherein the second selective coupling device is a transistor the controller selectively causes to conduct when memory cells are not being read and selectively not to conduct when the memory cells are being read.

16. The voltage reading enhancement system of claim 12 wherein the controller is responsive to direct the selective coupling device to recouple the substrate in the active sub-array to the corresponding substrate in the reference sub-array when the active row signal is not received.

17. The voltage reading enhancement system of claim 13 wherein the controller is responsive to direct the second selective coupling device to recouple the cell plate in the active sub-array to the corresponding cell plate in the reference sub-array when the active row signal is not received.

18. An open digit line array DRAM device comprising:
 a plurality of sub-arrays of memory cells, the memory cells being disposed in rows and columns;
 a plurality of sense amplifiers disposed between the sub-arrays, each of the sense amplifiers receiving a first digit line from a column of memory cells in a first sub-array and second digit line from a column of memory cells in a second sub-array;
 a row addressing system operably connected to the DRAM device, the row addressing system responsive to a row address signal by accessing a row in the DRAM device corresponding to the row address signal;
 a refresh indicator signaling when a row of memory cells is to be refreshed;
 a row refreshing circuit, operably connected with the row addressing system, the DRAM cells, and the refresh indicator, the row refreshing circuit directing a refresh of at least one row of memory cells in response to the refresh indicator signaling a row of memory cells is to be refreshed; and
 a voltage reading enhancement system comprising:
  a selective coupling device selectively electrically coupling a component of an active sub-array to a corresponding component of a reference sub-array; and
  a controller coupled with the selective coupling device and operable to receive an active row signal, the active row signal indicating an active row of memory cells within the active sub-array is to be coupled with an active digit line, the controller being responsive to the active row signal to direct the selective coupling device to decouple the component in the active sub-array from the corresponding component in the reference sub-array when the active row signal is received.

19. The open digit line array DRAM device of claim 18 wherein the component of the active sub-array comprises a cell plate of the active sub-array, and wherein the corresponding component of the reference sub-array comprises a cell plate of the reference sub-array.

20. The open digit line array DRAM device of claim 18 wherein the component of the active sub-array comprises a substrate of the active sub-array, and wherein the corresponding component of the reference sub-array comprises a substrate of the reference sub-array.

21. The open digit line array DRAM device of claim 18 wherein the selective coupling device is a transistor the controller selectively causes to conduct when memory cells are not being read and selectively not to conduct when the memory cells are being read.

22. The open digit line array DRAM device of claim 18 wherein the controller is responsive to direct the selective coupling device to recouple the component in the active sub-array to the corresponding component in the reference sub-array when the active row signal is not received.

23. A memory system comprising:
   a memory controller;
   a memory bus operably coupled with the memory controller to communicate memory commands from the memory controller and communicate memory output signals to the memory controller; and
   a plurality of open digit line array DRAM device, each open digit line DRAM device comprising:
      a plurality of sub-arrays of memory cells, the memory cells being disposed in rows and columns;
      a plurality of sense amplifiers disposed between the sub-arrays, each of the sense amplifiers receiving a first digit line from a column of memory cells in a first sub-array and second digit line from a column of memory cells in a second sub-array;
      a row addressing system operably connected to the DRAM device, the row addressing system responsive to a row address signal by accessing a row in the DRAM device corresponding to the row address signal;
      a refresh indicator signaling when a row of memory cells is to be refreshed;
      a row refreshing circuit, operably connected with the row addressing system, the DRAM cells, and the refresh indicator, the row refreshing circuit directing a refresh of at least one row of memory cells in response to the refresh indicator signaling a row of memory cells is to be refreshed; and
      a voltage reading enhancement system comprising:
         a selective coupling device selectively electrically coupling a component of an active sub-array to a corresponding component of a reference sub-array; and
         a controller coupled with the selective coupling device and operable to receive an active row signal, the active row signal indicating an active row of memory cells within the active sub-array is to be coupled with an active digit line, the controller being responsive to the active row signal to direct the selective coupling device to decouple the component in the active sub-array from the corresponding component in the reference sub-array when the active row signal is received.

24. The memory system of claim 23 wherein the component of the active sub-array comprises a cell plate of the active sub-array, and wherein the corresponding component of the reference sub-array comprises a cell plate of the reference sub-array.

25. The memory system of claim 23 wherein the component of the active sub-array comprises a substrate of the active sub-array, and wherein the corresponding component of the reference sub-array comprises a substrate of the reference sub-array.

26. The memory system of claim 23 wherein the selective coupling device is a transistor the controller selectively causes to conduct when memory cells are not being read and selectively not to conduct when the memory cells are being read.

27. The memory system of claim 23 wherein the controller is responsive to direct the selective coupling device to recouple the component in the active sub-array to the corresponding component in the reference sub-array when the active row signal is not received.

28. A computer system, comprising:
   a processor;
   an input device, operably connected to the processor, allowing data to be entered into the computer system;
   an output device, operably connected to the processor, allowing data to be output from the computer system; and
   a system memory operably connected to the processor through a system bus, the system memory comprising a plurality of open digit line array DRAM devices having a plurality of rows of DRAM cells, the DRAM cells receiving, storing, and outputting data, the system memory comprising:
      a memory controller;
      a memory bus operably coupled with the memory controller to communicate memory commands from the memory controller and communicate memory output signals to the memory controller; and
      a plurality of open digit line array DRAM device, each open digit line DRAM device comprising:
         a plurality of sub-arrays of memory cells, the memory cells being disposed in rows and columns;
         a plurality of sense amplifiers disposed between the sub-arrays, each of the sense amplifiers receiving a first digit line from a column of memory cells in a first sub-array and second digit line from a column of memory cells in a second sub-array;
         a row addressing system operably connected to the DRAM device, the row addressing system responsive to a row address signal by accessing a row in the DRAM device corresponding to the row address signal;
         a refresh indicator signaling when a row of memory cells is to be refreshed;
         a row refreshing circuit, operably connected with the row addressing system, the DRAM cells, and the refresh indicator, the row refreshing circuit directing a refresh of at least one row of memory cells in response to the refresh indicator signaling a row of memory cells is to be refreshed; and
         a voltage reading enhancement system comprising:
            a selective coupling device selectively electrically coupling a component of an active sub-array to a corresponding component of a reference sub-array; and
            a controller coupled with the selective coupling device and operable to receive an active row signal, the active row signal indicating an active row of memory cells within the active sub-array is to be coupled with an active digit line, the controller being responsive to the active row signal to direct the selective coupling device to decouple the component in the active sub-array from the corresponding component in the reference sub-array when the active row signal is received.

29. The computer system of claim 28 wherein the component of the active sub-array comprises a cell plate of the active sub-array, and wherein the corresponding component of the reference sub-array comprises a cell plate of the reference sub-array.

30. The computer system of claim 28 wherein the component of the active sub-array comprises a substrate of the active sub-array, and wherein the corresponding component of the reference sub-array comprises a substrate of the reference sub-array.

31. The computer system of claim 28 wherein the selective coupling device is a transistor the controller selectively causes to conduct when memory cells are not being read and selectively not to conduct when the memory cells are being read.

32. The computer system of claim 28 wherein the controller is responsive to direct the selective coupling device to recouple the component in the active sub-array to the corresponding component in the reference sub-array when the active row signal is not received.

33. A method for enhancing the accuracy of reading stored memory cell voltages in an open digit line array DRAM device, the method comprising:
coupling a component of an active sub-array to a corresponding component of a reference sub-array; and
selectively decoupling the component of the active sub-array from the corresponding component of the reference sub-array when an active row of memory cells within the active sub-array is to be connected to an active digit line.

34. The method of claim 33 wherein the component of the active sub-array comprises a cell plate of the active sub-array, and wherein the corresponding component of the reference sub-array comprises a cell plate of the reference sub-array.

35. The method of claim 33 wherein the component of the active sub-array comprises a substrate of the active sub-array, and wherein the corresponding component of the reference sub-array comprises a substrate of the reference sub-array.

36. The method of claim 33 wherein the component of the active sub-array is recoupled to the corresponding component of the reference sub-array when an active row of memory cells within the active sub-array is not to be connected to an active digit line.

37. A method for enhancing the accuracy of reading stored memory cell voltages in an open digit line array DRAM device, the method comprising:
coupling a cell plate of an active sub-array to a corresponding cell plate of a reference sub-array; and
selectively decoupling the cell-plate of the active sub-array from the corresponding cell plate of the reference sub-array when an active row of memory cells within the active sub-array is to be connected to an active digit line.

38. The method of claim 37 further comprising coupling a substrate of the active sub-array to a corresponding substrate of the reference sub-array.

39. The method of claim 37 wherein the cell plate of the active sub-array is recoupled to the corresponding cell plate of the reference sub-array when an active row of memory cells within the active sub-array is not to be connected to an active digit line.

40. The method of claim 38 wherein the substrate of the active sub-array is recoupled to the corresponding substrate of the reference sub-array when an active row of memory cells within the active sub-array is not to be connected to an active digit line.

41. A method for enhancing the accuracy of reading stored memory cell voltages in an open digit line array DRAM device, the method comprising:
coupling a substrate of an active sub-array to a corresponding substrate of a reference sub-array; and
selectively decoupling the substrate of the active sub-array from the corresponding substrate of the reference sub-array when an active row of memory cells within the active sub-array is to be connected to an active digit line.

42. The method of claim 41 further comprising coupling a cell plate of the active sub-array to a corresponding substrate of the reference sub-array.

43. The method of claim 41 wherein the substrate of the active sub-array is recoupled to the corresponding substrate of the reference sub-array when an active row of memory cells within the active sub-array is not to be connected to an active digit line.

44. The method of claim 42 wherein the cell plate of the active sub-array is recoupled to the corresponding cell plate of the reference sub-array when an active row of memory cells within the active sub-array is not to be connected to an active digit line.

* * * * *

UNITED STATES PATENT AND TRADEMARK OFFICE
CERTIFICATE OF CORRECTION

PATENT NO. : 6,735,103 B2
DATED : May 11, 2004
INVENTOR(S) : Howard C. Kirsch

It is certified that error appears in the above-identified patent and that said Letters Patent is hereby corrected as shown below:

Title page,
Item [56], References Cited, U.S. PATENT DOCUMENTS, insert ommited references
-- 6,515,925   02/03   Graham et al.   ...365/205
    5,926,410   07/99   Raad et al.     ...365/63
    6,535,493   03/03   Cowles          ...365/200
    5,844,833   12/98   Zagar et al.    ...365/200
    6,549,476   04/03   Pinney          ...365/190
    6,566,206   05/03   Clampitt        ...438/296 --

Column 3,
Line 20, "exposed to difference noise sources" should read -- exposed to different noise sources --
Line 28, "to differently to the" should read -- differently to the --
Line 51, "can actually creates" should read -- can actually create --

Column 5,
Line 11, "digitlinedigit line array" should read -- digit line array --

Column 6,
Lines 57 and 58, "342 for for the reference" should read -- 342 for the reference --

Signed and Sealed this

Third Day of May, 2005

JON W. DUDAS
*Director of the United States Patent and Trademark Office*